(12) United States Patent
Johnson

(10) Patent No.: US 6,741,640 B1
(45) Date of Patent: May 25, 2004

(54) SYSTEM AND METHOD FOR MEASURING THE RETURN LOSS OF AN ANTENNA

(75) Inventor: Mitchell K. Johnson, McKinney, TX (US)

(73) Assignee: Samsung Electronics Co., Ltd., Suwon (KR)

(*) Notice: Subject to any disclaimer, the term of this patent is extended or adjusted under 35 U.S.C. 154(b) by 0 days.

(21) Appl. No.: 09/519,709

(22) Filed: Mar. 7, 2000

(51) Int. Cl.[7] .................................................. H04B 1/38
(52) U.S. Cl. ....................................................... 375/219
(58) Field of Search ................................. 375/219, 221, 375/220, 224, 227; 455/67.1

(56) References Cited

U.S. PATENT DOCUMENTS

| 4,041,395 A | 8/1977 | Hill .............................. 325/133 |
| 4,262,246 A | 4/1981 | Fujii .......................... 324/58 R |
| 4,290,009 A | 9/1981 | Sanpei et al. ............. 324/57 R |
| 4,427,936 A | 1/1984 | Riblet et al. .............. 324/58 R |
| 4,580,092 A | 4/1986 | Squire ........................ 324/57 R |
| 4,584,650 A | 4/1986 | Kozuch ....................... 364/481 |
| 5,157,338 A | 10/1992 | Motherbaugh et al. ..... 324/637 |
| 5,408,690 A | 4/1995 | Ishikawa et al. ............ 455/115 |
| 5,471,146 A * | 11/1995 | Krayeski et al. ........... 455/67.1 |
| 5,548,820 A | 8/1996 | Victorin ..................... 455/67.4 |
| 5,754,104 A | 5/1998 | Saito .......................... 340/539 |
| 6,178,310 B1 * | 1/2001 | Jeong ......................... 455/67.1 |
| 6,289,216 B1 * | 9/2001 | Koh et al. .................. 455/67.4 |
| 6,424,305 B2 * | 7/2002 | Huang et al. ............... 343/703 |

* cited by examiner

Primary Examiner—Don N. Vo

(57) ABSTRACT

There is disclosed a system for determining the impedance match of an antenna, for use in an RF transceiver comprising an RF transmit path comprising circuitry capable of amplifying an RF signal and transmitting the amplified RF signal to the antenna coupled to the RF transceiver. The system comprises: 1) a test signal generator coupled to the RF transmit path for generating a first test signal and injecting the first test signal into the RF transmit path, wherein the RF transmit path amplifies the first test signal; 2) an RF mixer coupled to an output of the RF transmit path for downconverting the amplified first test signal to produce a second test signal at a frequency within a receive frequency band of the RF transceiver; 3) an RF coupler coupled to an output of the RF mixer for transmitting the second test signal into the antenna and for receiving a reflection of the second test signal; and 4) a first signal monitor coupled to the RF coupler for measuring the reflection of the second test signal.

14 Claims, 4 Drawing Sheets

SYSTEM AND METHOD FOR MEASURING THE RETURN LOSS OF AN ANTENNA

CROSS-REFERENCE TO RELATED APPLICATIONS

The present invention is related to that disclosed in U.S. patent application Ser. No. 09/475,604, filed Dec. 30, 1999, entitled "COMBINED SYSTEM FOR CALIBRATING RECEIVER GAIN AND MEASURING ANTENNA IMPEDANCE MATCH AND METHOD OF OPERATION." U.S. patent application Ser. No. 09/475,604 is commonly assigned to the assignee of the present invention. The disclosure of the related patent application is hereby incorporated by reference in the present application as if fully set forth herein.

TECHNICAL FIELD OF THE INVENTION

The present invention is directed, in general, to wireless communications systems and, more specifically, to a system for measuring receiver antenna impedance match in a base station in a wireless network.

BACKGROUND OF THE INVENTION

In order to increase the number of subscribers that can be serviced in a single wireless network, frequency reuse is maximized by making individual cell sites smaller and using a greater number of cell sites to cover the same geographical area. Accordingly, the greater number of base transceiver stations increases infrastructure costs. To offset this increased cost, wireless service providers continually implement any improvements that may reduce equipment costs, maintenance and repair costs, and operating costs, or that may increase service quality and reliability, and the number of subscribers that the cellular system can service.

Wireless service providers use a variety of test equipment to monitor the performance of the RF receiver and the RF transmitter of a base transceiver station (BTS). The test equipment may monitor a variety of signal parameters in the RF transmitter, including adjacent channel power ratio (ACPR), spectral purity (including in-band and out-of-band spurious components), occupied bandwidth, RHO, frequency error, and code domain power. The test equipment may also perform a variety of test functions in the RF receiver, including receive antenna impedance matching and receiver calibration. Preferably, the signal parameters are remotely monitored from a central location, so that a wireless service provider can avoid the expense of sending maintenance crews into the field to test each BTS individually. Additionally, a remote monitoring system can detect the failure of an RF transmitter or an RF receiver nearly instantaneously.

Unfortunately, adding some types of test equipment, such as spectrum analyzers, to a BTS significantly increases the cost of the BTS. In some cases, the cost of the test equipment may be greater than the cost of the BTS itself. As a result, wireless service providers frequently do not install test equipment in base transceiver stations, or install only a limited amount of test equipment to test only some of the functions of the BTS. The remaining functions must be monitored by maintenance crews using portable test equipment.

There is therefore a need in the art for inexpensive test equipment that may be implemented as part of the base station. In particular, there is a need for integrated test equipment that can perform reuse some of the existing circuitry in a base transceiver station. More particularly, there is a need for integrated test equipment that can be used to measure the impedance match of the receiver antenna.

SUMMARY OF THE INVENTION

To address the above-discussed deficiencies of the prior art, it is a primary object of the present invention to provide a system for determining the impedance match of an antenna for use in an RF transceiver comprising an RF transmit path comprising circuitry capable of amplifying an RF signal and transmitting the amplified RF signal to the antenna coupled to the RF transceiver. In an advantageous embodiment of the present invention, the system comprises: 1) a test signal generator coupled to the RF transmit path and capable of generating a first test signal and injecting the first test signal into the RF transmit path, wherein the RF transmit path amplifies the first test signal; 2) an RF mixer coupled to an output of the RF transmit path and capable of down-converting the amplified first test signal to produce a second test signal at a frequency within a receive frequency band of the RF transceiver; 3) an RF coupler coupled to an output of the RF mixer and capable of transmitting the second test signal into the antenna and capable of receiving a reflection of the second test signal; and 4) a first signal monitor coupled to the RF coupler capable of measuring the reflection of the second test signal.

According to one embodiment of the present invention, the test signal generator generates the first test signal at a center frequency of a transmit frequency band of the RF transceiver.

According to another embodiment of the present invention, the second test signal is at a center frequency of the receive frequency band.

According to still another embodiment of the present invention, the system further comprises a second signal monitor coupled to the RF mixer and capable of determining at least one parameter of the second test signal.

According to yet another embodiment of the present invention, the system further comprises a signal splitter coupled to the RF mixer output capable of generating the second test signal on a first split output and a second split output signal on a second split output, wherein the second split output signal is substantially equal to the second test signal.

According to a further embodiment of the present invention, the second signal monitor monitors the second split output signal to determine the at least one parameter of the second test signal.

According to a yet further embodiment of the present invention, the RF coupler is coupled to, and receives the second test signal from, the second split output of the signal splitter.

According to a still further embodiment of the present invention, the system further comprises a controller capable of comparing at least one parameter of the reflection of the second test signal with the at least one parameter of the second test signal.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art should appreciate that they may readily use the conception and the specific embodiment disclosed as a basis for modifying or designing other structures for carrying out the same purposes of the present invention. Those skilled in the art should also realize that such equivalent constructions do not depart from the spirit and scope of the invention in its broadest form.

Before undertaking the DETAILED DESCRIPTION, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present invention, and the advantages thereof, reference is now made to the following descriptions taken in conjunction with the accompanying drawings, wherein like numbers designate like objects, and in which.

DETAILED DESCRIPTION

FIGS. 1 through 4, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged wireless network.

Figure 1:
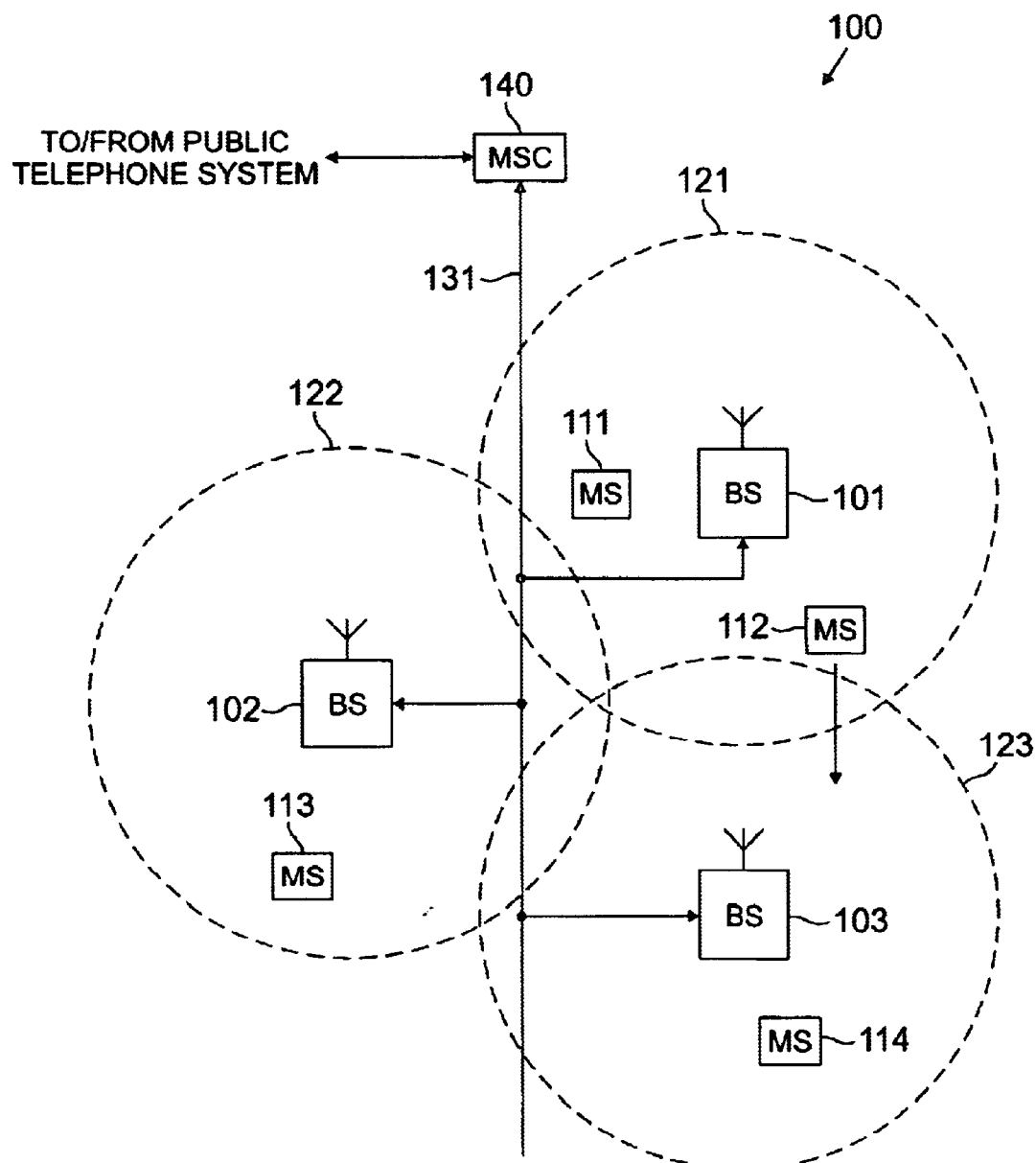
FIG. 1 illustrates an exemplary wireless network according to one embodiment of the present invention.

FIG. 1 illustrates an exemplary wireless network 100 according to one embodiment of the present invention. The wireless telephone network 100 comprises a plurality of cell sites 121–123, each containing one of the base stations, BS 101, BS 102, or BS 103. Base stations 101–103 are operable to communicate with a plurality of mobile stations (MS) 111–114. Mobile stations 111–114 may be any suitable cellular devices, including conventional cellular telephones, PCS handset devices, portable computers, metering devices, and the like.

Dotted lines show the approximate boundaries of the cells sites 121–123 in which base stations 101–103 are located. The cell sites are shown approximately circular for the purposes of illustration and explanation only. It should be clearly understood that the cell sites may have other irregular shapes, depending on the cell configuration selected and natural and man-made obstructions.

In one embodiment of the present invention, BS 101, BS 102, and BS 103 may comprise a base station controller (BSC) and a base transceiver station (BTS). Base station controllers and base transceiver stations are well known to those skilled in the art. A base station controller is a device that manages wireless communications resources, including the base transceiver station, for specified cells within a wireless communications network. A base transceiver station comprises the RF transceivers, antennas, and other electrical equipment located in each cell site. This equipment may include air conditioning units, heating units, electrical supplies, telephone line interfaces, and RF transmitters and RF receivers, as well as call processing circuitry. For the purpose of simplicity and clarity in explaining the operation of the present invention, the base transceiver station in each of cells 121, 122, and 123 and the base station controller associated with each base transceiver station are collectively represented by BS 101, BS 102 and BS 103, respectively.

BS 101, BS 102 and BS 103 transfer voice and data signals between each other and the public telephone system (not shown) via communications line 131 and mobile switching center (MSC) 140. Mobile switching center 140 is well known to those skilled in the art. Mobile switching center 140 is a switching device that provides services and coordination between the subscribers in a wireless network and external networks, such as the public telephone system. Communications line 131 may be any suitable connection means, including a T1 line, a T3 line, a fiber optic link, a network backbone connection, and the like. In some embodiments of the present invention, communications line 131 may be several different data links, where each data link couples one of BS 101, BS 102, or BS 103 to MSC 140.

In the exemplary wireless network 100, MS 111 is located in cell site 121 and is in communication with BS 101, MS 113 is located in cell site 122 and is in communication with BS 102, and MS 114 is located in cell site 123 and is in communication with BS 103. The MS 112 is also located in cell site 121, close to the edge of cell site 123. The direction arrow proximate MS 112 indicates the movement of MS 112 towards cell site 123. At some point, as MS 112 moves into cell site 123 and out of cell site 121, a "handoff" will occur.

As is well known, the handoff procedure transfers control of a call from a first cell to a second cell. For example, if MS 112 is in communication with BS 101 and senses that the signal from BS 101 is becoming unacceptably weak, MS 112 may then switch to a BS that has a stronger signal, such as the signal transmitted by BS 103. MS 112 and BS 103 establish a new communication link and a signal is sent to BS 101 and the public telephone network to transfer the on-going voice, data, or control signals through BS 103. The call is thereby seamlessly transferred from BS 101 to BS 103. An "idle" handoff is a handoff between cells of a mobile device that is communicating in the control or paging channel, rather than transmitting voice and/or data signals in the regular traffic channels.

Figure 2:
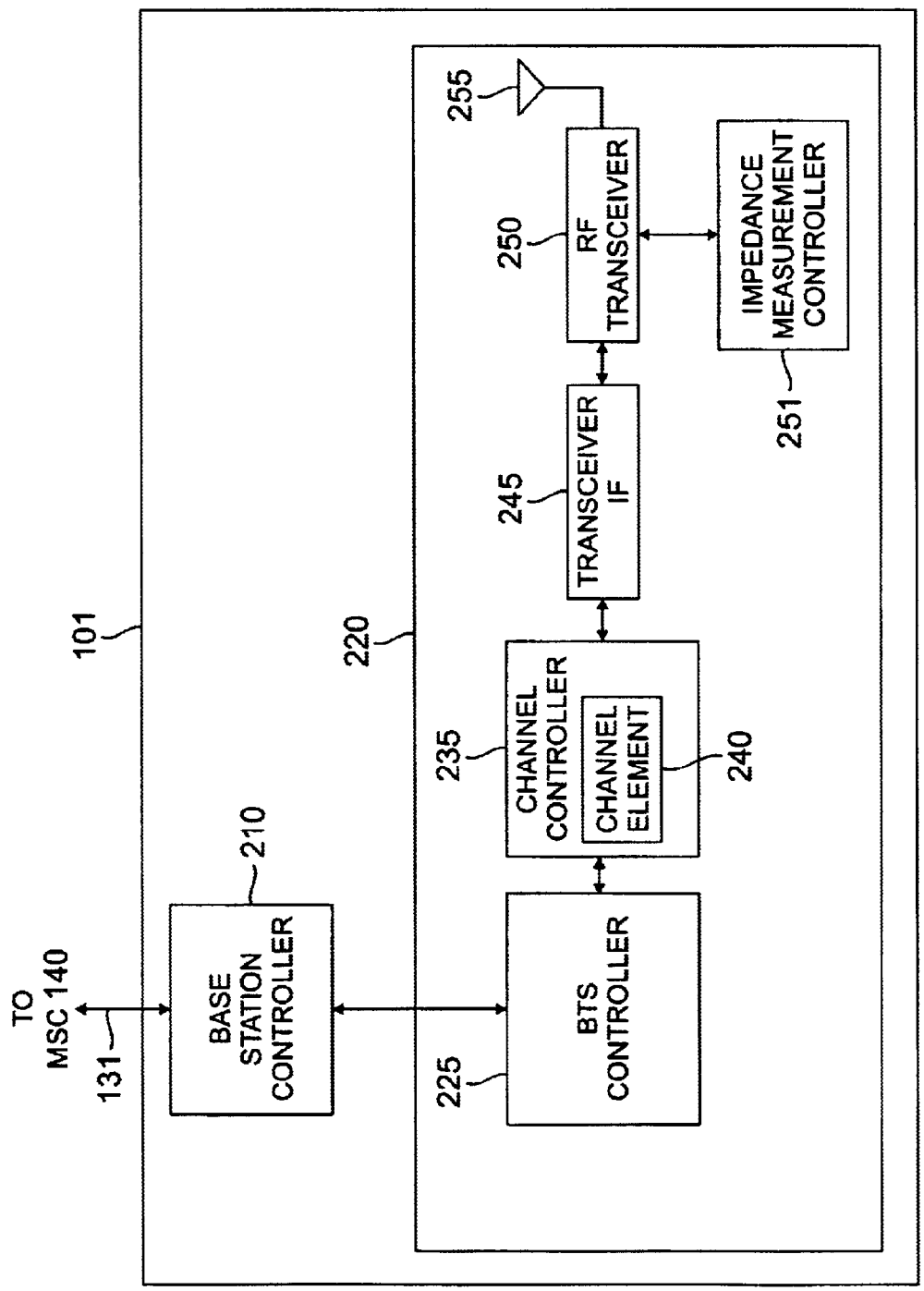
FIG. 2 illustrates in greater detail an exemplary base station in accordance with one embodiment of the present invention.

FIG. 2 illustrates in greater detail exemplary base station 101 in accordance with one embodiment of the present invention. Base station 101 comprises base station controller (BSC) 210 and base transceiver station (BTS) 220. Base station controllers and base transceiver stations were described previously in connection with FIG. 1. BSC 210 manages the resources in cell site 121, including BTS 220. BTS 220 comprises BTS controller 225, channel controller 235, which contains representative channel element 240, transceiver interface (IF) 245, RF transceiver unit 250, antenna array 255 and impedance measurement controller 251.

BTS controller 225 comprises processing circuitry and memory capable of executing an operating program that controls the overall operation of BTS 220 and communicates with BSC 210. Under normal conditions, BTS controller 225 directs the operation of channel controller 235, which contains a number of channel elements, including channel element 240, that perform bi-directional communications in the forward channel and the reverse channel. A "forward" channel refers to outbound signals from the base station to the mobile station and a "reverse" channel refers to inbound signals from the mobile station to the base station. In an advantageous embodiment of the present invention, the channel elements operate according to a code division multiple access (CDMA) protocol with the mobile stations in cell 121. Transceiver IF 245 transfers the bi-directional channel signals between channel controller 235 and RF transceiver unit 250.

Impedance measurement controller 251, in conjunction with circuitry located in RF transceiver 250, measures the receiver gain and the impedance match for the receive portion of antenna 255. Portions of RF transceiver 250 and the operation of impedance measurement controller 251 are described below in greater detail in connection with FIGS. 3 and 4.

Antenna array 255 transmits forward channel signals from RF transceiver unit 250 to mobile stations in the coverage area of BS 101. Antenna array 255 also sends to transceiver 250 reverse channel signals received from mobile stations in the coverage area of BS 101. In a preferred embodiment of the present invention, antenna array 255 is multi-sector antenna, such as a three sector antenna in which each antenna sector is responsible for transmitting and receiving in a 120° arc of coverage area. Additionally, RF transceiver 250 may contain an antenna selection unit to select among different antennas in antenna array 255 during both transmit and receive operations.

Figure 3:
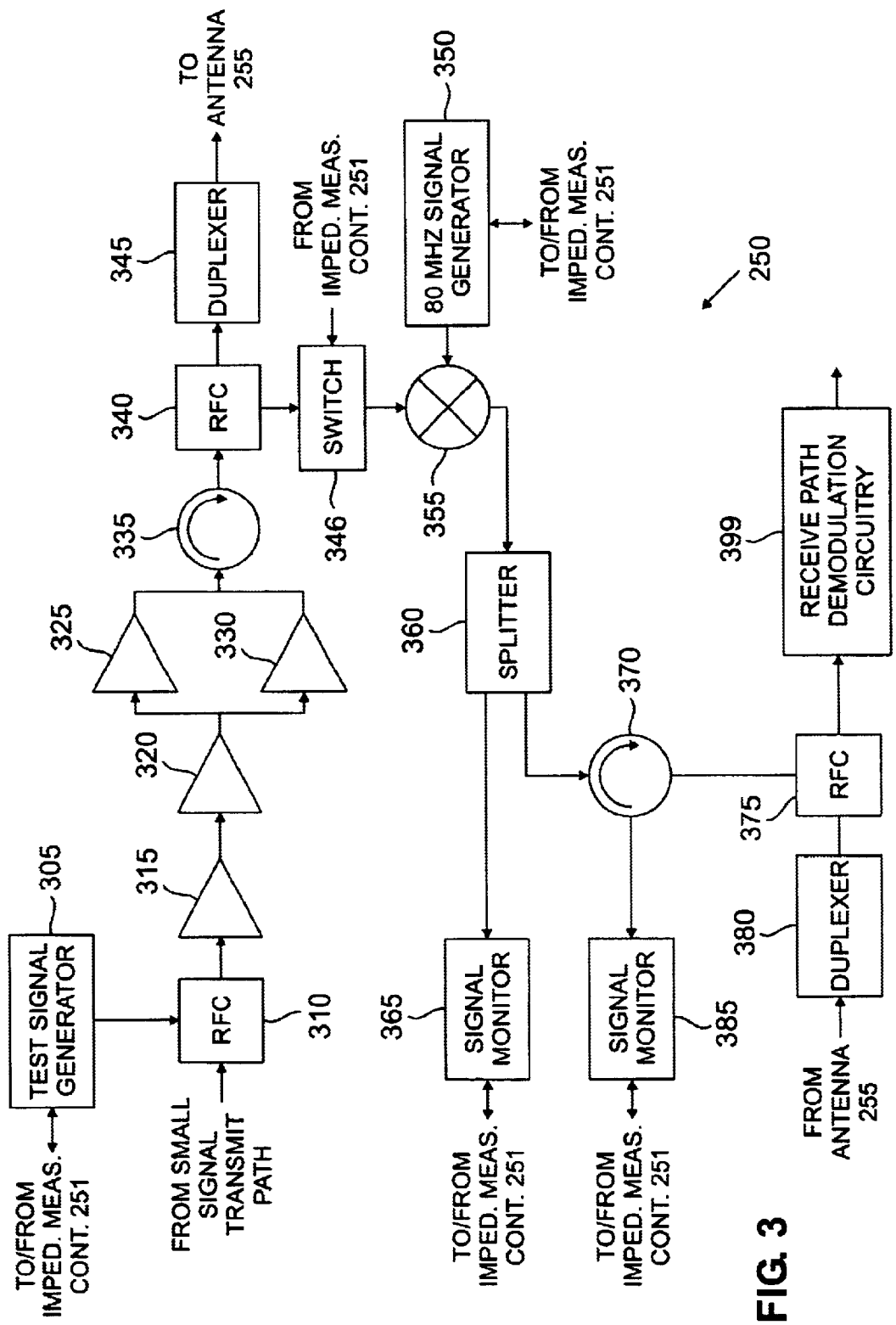
FIG. 3 illustrates in greater detail an exemplary RF transceiver in accordance with one embodiment of the present invention.

FIG. 3 illustrates a portion of exemplary RF transceiver 250 according to one embodiment of the present invention. RF transceiver 250 comprises a transmit signal path comprising radio frequency coupler (RFC) 310, RF amplifiers 315, 320, 325, and 330, circulator 335, RFC 340, and duplexer 345, which sends the RF output signals to antenna array 255. RF transceiver 250 also comprises antenna impedance measuring circuitry comprising test signal generator 305, switch 346, 80 MHz signal generator 350, RF mixer 355, signal splitter 360, signal monitor 365, RF circulator 370, and signal monitor 385. Finally, RF transceiver 250 comprises a receive signal path, a portion of which comprises RFC 375, which receives incoming RF signals from antenna array 255, duplexer 380, and receive path demodulation circuitry 399.

In one embodiment of the present invention, test signal generator 305 generates an output test signal which is at the center frequency (for example, 1960 MHz) of the transmit (or forward) channel signal frequency band (for example, 1930–1990 MHz). Thus, the output test signal from test signal generator 305 is 80 MHz above the center frequency (for example, 1880 MHz) of the receive (or reverse) channel frequency band (for example, 1850–1910 MHz). In the illustrated embodiment, RFC 310 receives signals from the small signal transmit path or from test signal generator 305 and generates a combined signal as an input to RF amplifier 315. In another embodiment of the present invention, the test signal may also be generated by, for example, channel element 240. If channel element 240 is used to generate the test signal, RFC 310 receives the test signal from the small signal transmit path, rather than from test signal generator 305. In fact, if the test signal is generated exclusively by channel element 240, both RFC 310 and test signal generator 305 may be omitted and the test signal may be received by RF amplifier 315 directly from the small signal transmit path.

Impedance measurement controller 251 may selectively enable and disable the output of test signal generator 305, depending upon whether test mode is enabled and whether an isolated test signal is desired. The low level voltage output of RFC 310 is first amplified in series stages by RF amplifiers 315 and 320. Parallel RF amplifiers 325 and 330 amplify the output of RF amplifier 320 in order to increase the output current that ultimately drives antenna array 255.

Circulator 335 transmits the amplified RF signal from parallel amplifiers 325 and 330 to RFC 340. Duplexer 345 transmits the RF signal from RFC 340 to antenna array 255. Duplexer 345 serves as an RF filter and directional coupler and permits sharing of antenna array 255 by the RF transmitter and RF receiver portions of transceiver 250. Duplexer 345 may isolate the transmit frequencies in the exemplary 1930–1990 MHz frequency band from the receive signals in the exemplary 1850–1910 frequency band.

RFC 340 transmits a copy of the RF transmit signal to one input of RF mixer 355. The other input of RF mixer 355 is connected to the output of 80 MHz signal generator 350, which may be selectively enabled and disabled by impedance measurement controller 251. Impedance measurement controller 251 also opens and closes switch 346 depending on whether or not the return loss is being measured by impedance measurement controller 251. If test measurements are not being performed, impedance measurement controller 251 opens switch 346 to prevent signals from being injected into the test signal path. RF mixer 355 down-converts the RF output from RFC 340 by the 80 MHz reference signal. Thus, the 1960 MHz test signal is down-shifted 80 MHz to produce a 1880 MHz test signal at the output of RF mixer 355. The 1880 MHz test signal falls directly in the center of the receiver operating frequency band (1850–1910 MHz) and has a power level that is high enough to be discernable above expected noise levels.

The output from RF mixer 355 is connected to the input of splitter 360. Splitter 360 generates two identical copies of the test signal at the center of the receiver frequency range for signal monitoring purposes. Under the direction of impedance measurement controller 251, signal monitor 365 measures one or more signal parameters, such as amplitude, frequency, and the like, of one of the identical "split" test signals that signal impedance measurement controller 251 receives from splitter 360. Signal monitor 365 provides an accurate measurement (i.e., an initial reference level) of the 1880 MHz test signal that is to be injected into antenna 255.

Circulator 370 receives the other identical "split" test signal from splitter 360 and transmits the 1880 MHz test signal into RFC 375. RFC 375 injects the test signal from circulator 370 into duplexer 380. Under normal operating conditions, duplexer 380 filters the signals received from antenna array 255 and transmits the filtered reverse channel frequency band (i.e., 1850–1910 MHz) through RFC 375 to receive path demodulation circuitry 399. Forward channel signals transmitted from antenna array 255 are filtered out by duplexer 380.

Since the 1880 MHz test signal is in the center of the receive frequency band, duplexer 380 transmits the test signal into antenna array 255. Under ideal conditions, if the impedance of antenna array 255 is properly matched, there will be no signal reflection from antenna array 255 back to duplexer 380. However, under normal operating conditions, the injected test signal is at least partially reflected from antenna array 255 back to duplexer 380. Duplexer 380 and RFC 375 transmit a portion of the reflected test signal back to circulator 370. Circulator 370 transmits the reflected test signal to signal monitor 385.

Signal monitor 385, operating under the direction of impedance measurement controller 251, measures the reflected test signal that signal impedance measurement controller 251 receives from circulator 370. Signal monitor 385 provides an accurate measurement of the reflected 1880 MHz test signal that may be compared to the original test signal measured by test monitor 365.

In one embodiment of the present invention, the monitor characteristic curve (V/dB) is stored in impedance measurement controller 251. Impedance measurement controller 251 determines the antenna match from the voltage standing wave ratio (VSWR) of the antenna by comparing the power level (in dB) of the injected test signal measured by signal monitor 365 to the power level (in dB) of the reflected test signal measured by signal monitor 385.

As described, exemplary RF transceiver 250 and impedance measurement controller 251 are capable of measuring the impedance match of the antenna array 255. In an advantageous embodiment of the present invention, RF transceiver 250 and impedance measurement controller 251 perform these measurements while BTS 220 continues to process forward and reverse channel information.

Figure 4:
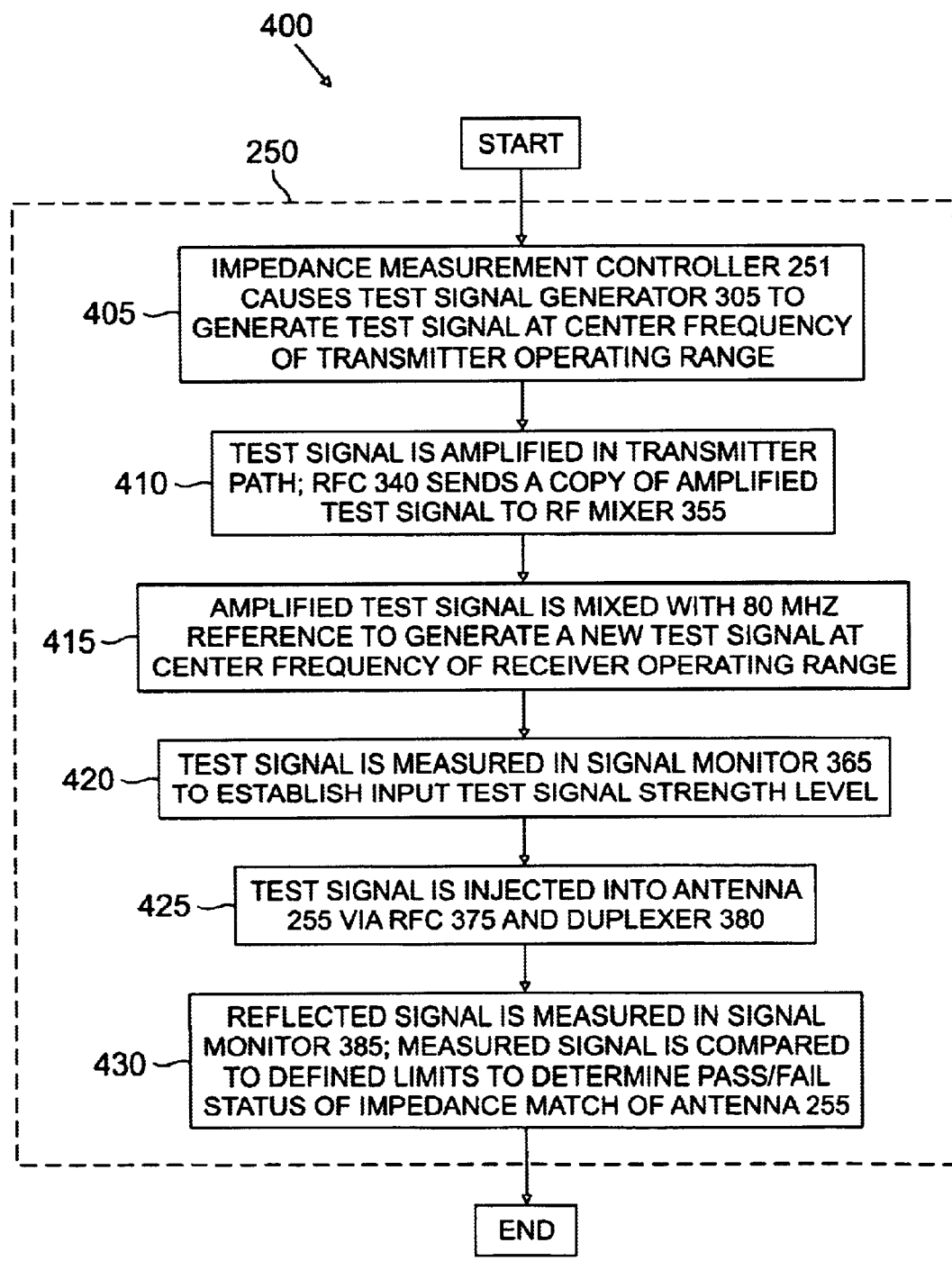
FIG. 4 illustrates an exemplary flow diagram in accordance with one embodiment of the present invention.

FIG. 4 illustrates flow diagram 400, which illustrates the operation of the exemplary antenna impedance matching test circuitry in RF transceiver 250 of base transceiver station (BTS) 220. Initially, impedance measurement controller 251 causes test signal generator 305 to generate a test signal at the center frequency, typically 1960 MHz, of the transmitter operating frequency range (process step 405) Next, the test signal is amplified in the transmitter path to a sufficient level for input to RFC 340. RFC 340 provides a copy of the RF transmitter output to duplexer 345 for transfer to antenna array 255 and a separate copy for output to RF mixer 355 (process step 410). RF mixer 355 mixes the amplified test signal with an 80 MHz reference signal to generate a new test signal at the center frequency of the receiver operating range, typically 1880 MHz (process step 415). The resultant test signal is measured in signal monitor 365 to establish an input test signal strength reference level (process step 420). The test signal is also injected into antenna array 255 via RFC 375 and duplexer 380 (process step 425). The reflected signal from antenna array 255 is measured in signal monitor 385. Under the control of impedance measurement controller 251, the measured reflected signal is compared to user-defined threshold values to determine a pass/fail status for the impedance match of antenna array 255 (process step 430).

Although the present invention has been described in detail, those skilled in the art should understand that they can make various changes, substitutions and alterations herein without departing from the spirit and scope of the invention in its broadest form.

What is claimed is:

1. For use in an RF transceiver comprising an RF transmit path comprising circuitry capable of amplifying an RF signal and transmitting said amplified RF signal to an antenna coupled to said RF transceiver, a system for determining an impedance match of said antenna comprising:
    a test signal generator coupled to said RF transmit path and capable of generating a first test signal and injecting said first test signal into said RF transmit path, wherein said RF transmit path amplifies said first test signal;
    an RF mixer coupled to an output of said RF transmit path and capable of down-converting said amplified first test signal to produce a second test signal at a frequency within a receive frequency band of said RF transceiver;
    an RF coupler coupled to an output of said RF mixer and capable of transmitting said second test signal into said antenna and capable of receiving a reflection of said second test signal;
    a first signal monitor coupled to said RF coupler capable of measuring said reflection of said second test signal;
    a second signal monitor coupled to said RF mixer and capable of determining at least one parameter of said second test signal; and
    a signal splitter coupled to said RF mixer output capable of generating said second test signal on a first split output and a second split output signal on a second split output, wherein said second split output signal is substantially equal to said second test signal.

2. The system as set forth in claim 1 wherein said test signal generator generates said first test signal at a center frequency of a transmit frequency band of said RF transceiver.

3. The system as set forth in claim 1 wherein said second test signal is at a center frequency of said receive frequency band.

4. The system as set forth in claim 1 wherein second signal monitor monitors said second split output signal to determine said at least one parameter of said second test signal.

5. The system as set forth in claim 4 wherein RF coupler is coupled to, and receives said second test signal from, said second split output of said signal splitter.

6. The system as set forth in claim 5 further comprising a controller capable of comparing at least one parameter of said reflection of said second test signal with said at least one parameter of said second test signal.

7. A wireless network comprising:
    a plurality of base stations, each of said base stations capable of communicating with a plurality of mobile stations, at least one of said base stations comprising:
    an antenna;
    an RF transceiver coupled to said antenna, said RF transceiver comprising an RF transmit path comprising circuitry capable of amplifying an RF signal and transmitting said amplified RF signal to said antenna; and
    a system associated with said RF transceiver capable of determining an impedance match of said antenna comprising:
        a test signal generator coupled to said RF transmit path and capable of generating a first test signal and injecting said first test signal into said RF transmit path, wherein said RF transmit path amplifies said first test signal;

an RF mixer coupled to an output of said RF transmit path and capable of down-converting said amplified first test signal to produce a second test signal at a frequency within a receive frequency band of said RF transceiver;

an RF coupler coupled to an output of said RF mixer and capable of transmitting said second test signal into said antenna and capable of receiving a reflection of said second test signal;

a first signal monitor coupled to said RF coupler capable of measuring said reflection of said second test signal;

a second signal monitor coupled to said RF mixer and capable of determining at least one parameter of said second test signal; and a signal splitter coupled to said RF mixer output capable of generating said second test signal on a first split output and a second split output signal on a second split output, wherein said second split output signal is substantially equal to said second test signal.

8. The wireless network as set forth in claim 7 wherein said test signal generator generates said first test signal at a center frequency of a transmit frequency band of said RF transceiver.

9. The wireless network as set forth in claim 7 wherein said second test signal is at a center frequency of said receive frequency band.

10. The wireless network as set forth in claim 7 wherein second signal monitor monitors said second split output signal to determine said at least one parameter of said second test signal.

11. The wireless network as set forth in claim 10 wherein RF coupler is coupled to, and receives said second test signal from, said second split output of said signal splitter.

12. The wireless network as set forth in claim 11 further comprising a controller capable of comparing at least one parameter of said reflection of said second test signal with said at least one parameter of said second test signal.

13. For use in an RF transceiver comprising an RF transmit path comprising circuitry capable of amplifying an RF signal and transmitting the amplified RF signal to an antenna coupled to the RF transceiver, a method for determining an impedance match of the antenna comprising the steps of:

generating a first test signal at a center frequency of a transmit frequency band of the RF transceiver and injecting the first test signal into the RF transmit path, wherein the RF transmit path amplifies the first test signal;

down-converting the amplified first test signal in an RF mixer coupled to an output of the RF transmit path to produce a second test signal at a center frequency of the receive frequency band;

transmitting the second test signal into the antenna;

receiving in a first signal monitor a reflection of the second test signal and measuring at least one parameter of a reflection of the second test signal; and receiving in a second signal monitor the second test signal and determining at least one parameter of the second test signal.

14. The method as set forth in claim 13 further comprising a controller capable of comparing the least one parameter of the reflection of the second test signal with the at least one parameter of the second test signal.

* * * * *